United States Patent
Oh

(10) Patent No.: US 10,271,037 B2
(45) Date of Patent: Apr. 23, 2019

(54) IMAGE SENSORS WITH HYBRID THREE-DIMENSIONAL IMAGING

(71) Applicant: SEMICONDUCTOR COMPONENTS INDUSTRIES, LLC, Phoenix, AZ (US)

(72) Inventor: Minseok Oh, San Jose, CA (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 4 days.

(21) Appl. No.: 15/410,939

(22) Filed: Jan. 20, 2017

(65) Prior Publication Data

US 2018/0213205 A1    Jul. 26, 2018

(51) Int. Cl.
| | |
|---|---|
| H01L 31/062 | (2012.01) |
| H04N 13/218 | (2018.01) |
| H01L 27/146 | (2006.01) |
| H04N 5/359 | (2011.01) |
| H04N 5/3745 | (2011.01) |
| H04N 5/369 | (2011.01) |
| H04N 5/33 | (2006.01) |
| H04N 9/04 | (2006.01) |

(52) U.S. Cl.
CPC ..... *H04N 13/218* (2018.05); *H01L 27/14621* (2013.01); *H01L 27/14627* (2013.01); *H01L 27/14634* (2013.01); *H01L 27/14636* (2013.01); *H01L 27/14645* (2013.01); *H01L 27/14649* (2013.01); *H01L 27/14654* (2013.01); *H04N 5/3592* (2013.01); *H04N 5/36961* (2018.08); *H04N 5/379* (2018.08); *H04N 5/37457* (2013.01); *H04N 5/332* (2013.01); *H04N 9/04555* (2018.08)

(58) Field of Classification Search
None
See application file for complete search history.

(56) References Cited

U.S. PATENT DOCUMENTS

| | | | | |
|---|---|---|---|---|
| 8,730,545 | B2* | 5/2014 | Endo | H04N 5/23212 358/505 |
| 2010/0020209 | A1 | 1/2010 | Kim | |
| 2012/0268566 | A1* | 10/2012 | Kim | H04N 5/3696 348/46 |
| 2013/0062500 | A1 | 3/2013 | Oh et al. | |
| 2013/0083225 | A1* | 4/2013 | Minowa | H01L 27/14607 348/294 |

(Continued)

FOREIGN PATENT DOCUMENTS

JP    WO 2016194337 A1 * 12/2016   ....... H01L 51/005

*Primary Examiner* — Kevin M Picardat
(74) *Attorney, Agent, or Firm* — Treyz Law Group, P.C.; Joseph F. Guihan

(57) ABSTRACT

Image sensors may include hybrid three-dimensional imaging pixel groups. The pixel groups may be capable of obtaining both phase detection information and time-of-flight information. A pixel group may have first and second photodiodes covered by a single microlens that are used to obtain phase detection information. The microlens may also cover a third photodiode that obtains time-of-flight information. The first and second photodiodes may be formed in a first substrate whereas the third photodiode may be formed in a second substrate. The first and second substrates may be connected by a metal interconnect layer.

16 Claims, 12 Drawing Sheets

(56) References Cited

U.S. PATENT DOCUMENTS

| | | |
|---|---|---|
| 2013/0182173 A1 | 7/2013 | Murata |
| 2013/0222552 A1 | 8/2013 | Agranov et al. |
| 2013/0234029 A1* | 9/2013 | Bikumandla ......... H01L 25/043 |
| | | 250/349 |
| 2014/0002636 A1 | 1/2014 | Lee et al. |
| 2015/0028442 A1* | 1/2015 | Miyanami ......... H01L 27/14623 |
| | | 257/435 |
| 2015/0053846 A1 | 2/2015 | Byun |
| 2015/0381951 A1* | 12/2015 | Mlinar ................... H04N 9/045 |
| | | 348/223.1 |
| 2016/0133659 A1* | 5/2016 | Chao ................. H01L 27/14612 |
| | | 257/231 |
| 2017/0200757 A1* | 7/2017 | Ihara ................. H01L 27/14634 |
| 2018/0108691 A1* | 4/2018 | Kamatani ............. H01L 51/005 |

\* cited by examiner

IMAGE SENSORS WITH HYBRID THREE-DIMENSIONAL IMAGING

BACKGROUND

This relates generally to imaging systems and, more particularly, to imaging systems with three-dimensional imaging capabilities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Some applications such as automatic focusing and three-dimensional (3D) imaging may require electronic devices to provide stereo and/or depth sensing capabilities. For example, to bring an object of interest into focus for an image capture, an electronic device may need to identify the distances between the electronic device and object of interest. To identify distances, conventional electronic devices use complex arrangements. Some arrangements require the use of multiple image sensors and camera lenses that capture images from various viewpoints. Other arrangements require the addition of lenticular arrays that focus incident light on sub-regions of a two-dimensional pixel array. Due to the addition of components such as additional image sensors or complex lens arrays, these arrangements lead to reduced spatial resolution, increased cost, and increased complexity.

Yet another arrangement for electronic devices to identify distances includes using phase detection pixels. However, conventional phase detection pixels may perform poorly without sufficient background light or a textured scene to image.

It would therefore be desirable to be able to provide improved pixel arrangements for image sensors.

DETAILED DESCRIPTION

Embodiments of the present invention relate to image sensors with three-dimensional imaging capabilities. For maximized functionality, image sensor may include hybrid three-dimensional imaging pixel groups. These pixel groups may be capable of obtaining both phase detection information and time-of-flight information. By including both functionalities, the image sensor may be capable of accurate three-dimensional imaging in a variety of settings and scenarios.

Figure 1:
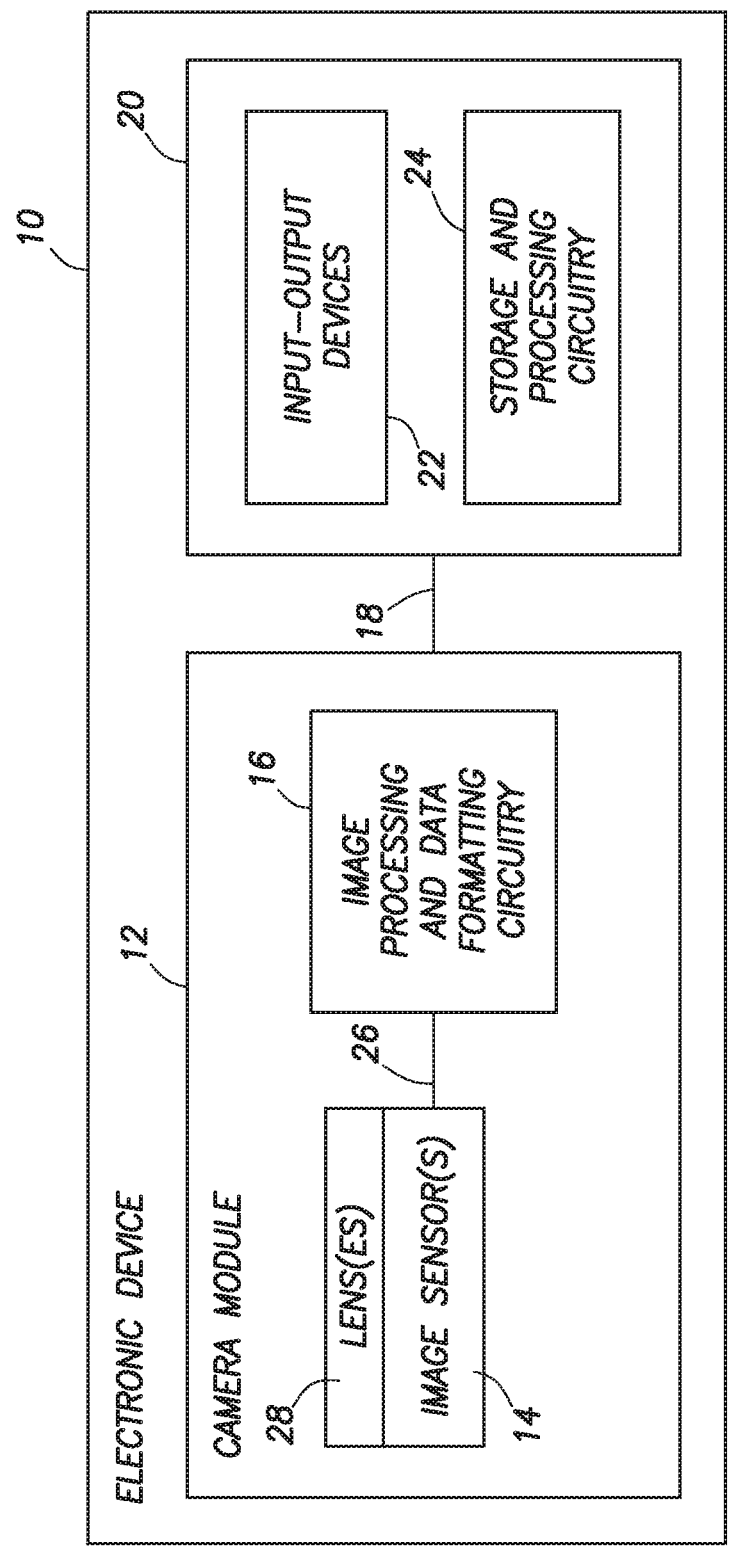
FIG. 1 is a schematic diagram of an illustrative electronic device with an image sensor that may include hybrid three-dimensional imaging pixel groups in accordance with an embodiment of the present invention.

An electronic device with a camera module is shown in FIG. 1. Electronic device 10 (sometimes referred to as an imaging system) may be a digital camera, a computer, a cellular telephone, a medical device, or other electronic device. Camera module 12 (sometimes referred to as an imaging device) may include one or more image sensors 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by three-dimensional imaging pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. For example, camera sensor 14 and image processing and data formatting circuitry 16 may be formed using separate integrated circuits that have been stacked.

Camera module 12 may convey acquired image data to host subsystems 20 over path 18 (e.g., image processing and data formatting circuitry 16 may convey image data to subsystems 20). Electronic device 10 (sometimes referred to as a system or imaging system) typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Input-output devices 22 may also include light sources such as light-emitting diodes that may be used in combination with image sensor(s) 14 to obtain time-of-flight depth sensing information. Input-output devices 22 may include, for example, a light source that emits visible or infrared light.

Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

It may be desirable to provide image sensors with depth sensing capabilities (e.g., to use in automatic focusing applications, 3D imaging applications such as machine vision applications, etc.). To provide depth sensing capabilities, image sensor 14 may include pixel groups with phase detection and time-of-flight functionality. A pixel pair with phase detection functionality is shown in FIG. 2A.

Figure 2A:
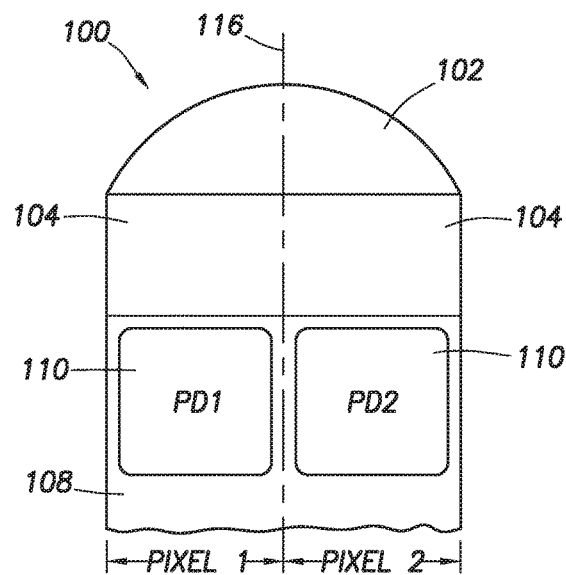
FIG. 2A is a cross-sectional view of illustrative phase detection pixels having photosensitive regions with different and asymmetric angular responses in accordance with an embodiment of the present invention.

FIG. 2A is an illustrative cross-sectional view of pixel pair 100. Pixel pair 100 may include first and second pixels such as Pixel 1 and Pixel 2. Pixel 1 and Pixel 2 may include photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. Microlens 102 may have a width and a length, with the length being longer than the width. Microlens 102 may have a length that is about twice as long as its width. Microlens 102 may be in the shape of an ellipse with an aspect ratio of about 2:1. In other embodiments, microlens 102 may be another shape such as a rectangle or another desired shape. Microlens 102 may have an aspect ratio of less than 2:1, 2:1, greater than 2:1, between 1.5:1 and 2.5:1, greater than 3:1, or any other desired aspect ratio.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the certain ranges of wavelengths). Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or back side illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

Figure 2B:
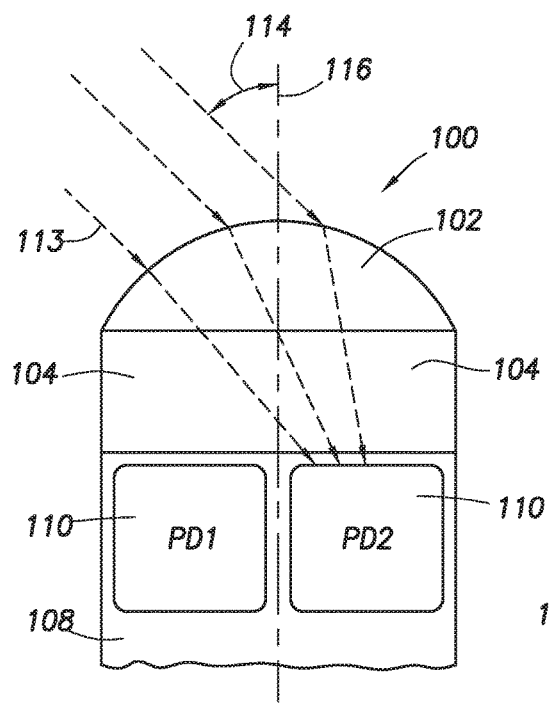
FIGS. 2B and 2C are cross-sectional views of the phase detection pixels of FIG. 2A in accordance with an embodiment of the present invention.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
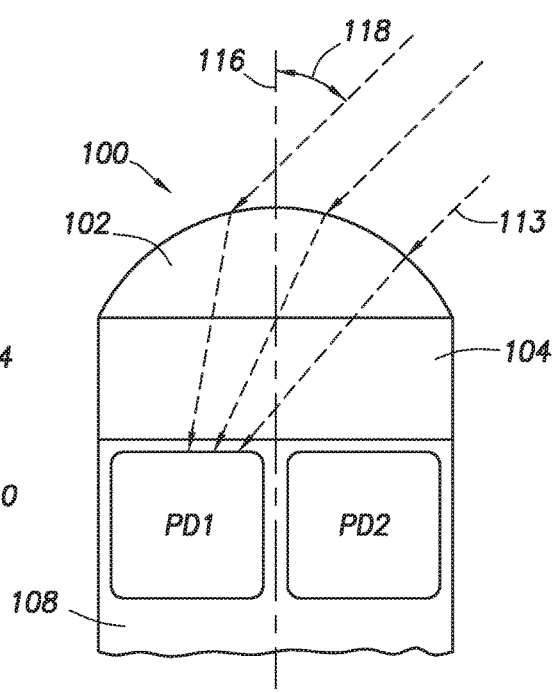

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
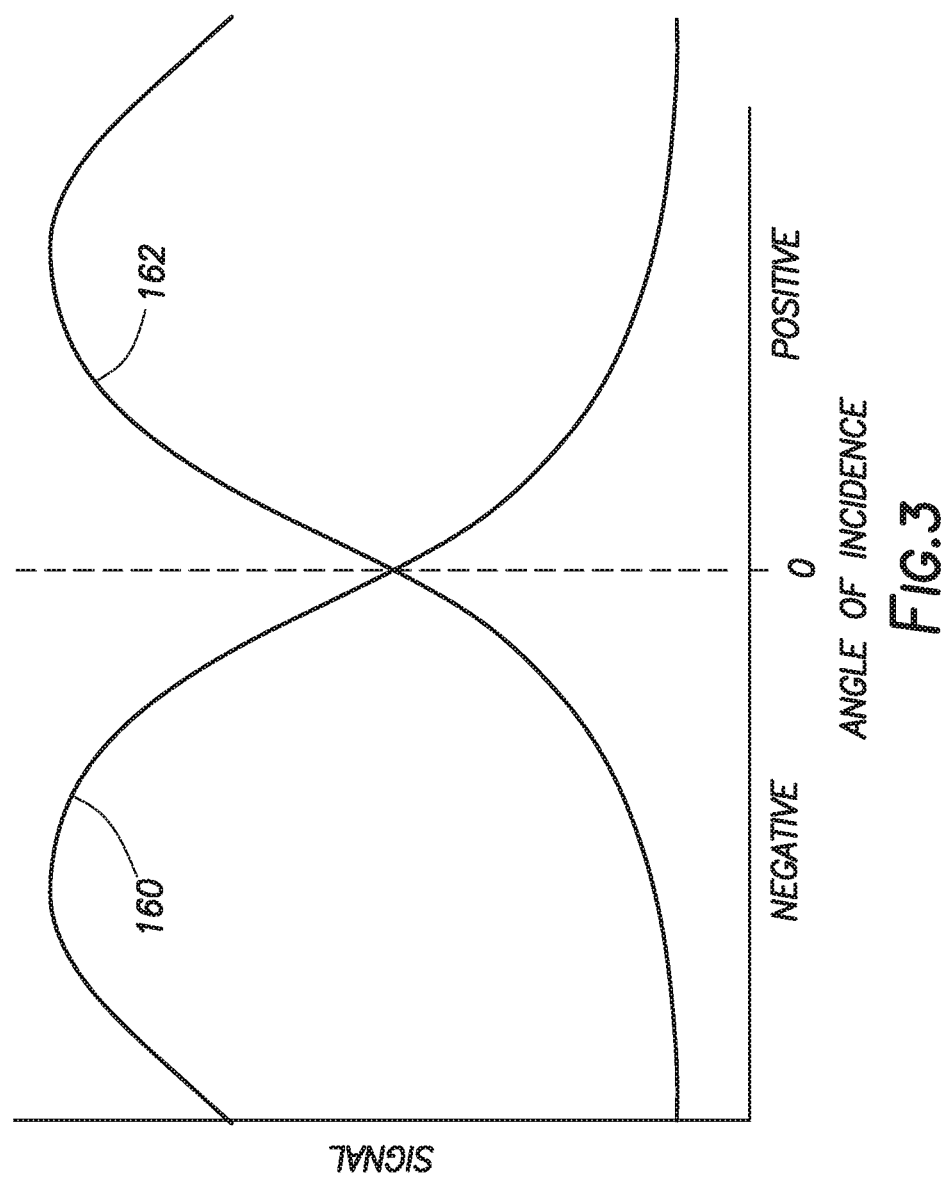
FIG. 3 is a diagram of illustrative signal outputs of phase detection pixels for incident light striking the phase detection pixels at varying angles of incidence in accordance with an embodiment of the present invention.

The positions of photodiodes PD1 and PD2 may sometimes be referred to as asymmetric positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). In the diagram of FIG. 3, an example of the pixel signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in camera module 12 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel groups that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

Figure 4:
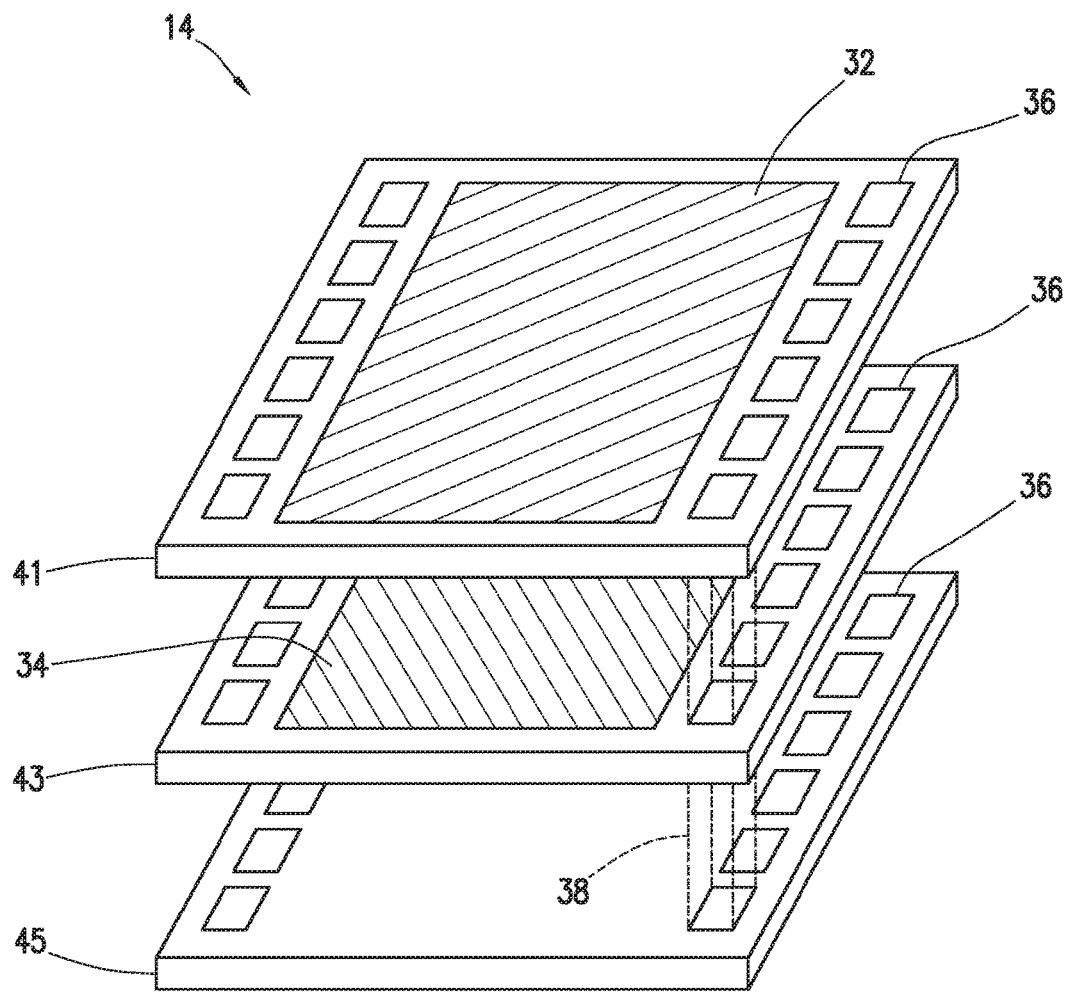
FIG. 4 is a perspective view of an image sensor with multiple substrates bonded together in accordance with an embodiment of the present invention.

FIG. 4 shows an illustrative image sensor such as image sensor 14 in FIG. 1. Image sensor 14 may sense light by converting impinging photons into electrons or holes that are integrated (collected) in sensor pixels. After completion of the integration cycle, collected charge may be converted into a voltage, which may be supplied to the output terminals of image sensor 14. In embodiments where image sensor 14 is a complementary metal-oxide semiconductor (CMOS) image sensor, the charge to voltage conversion may be accomplished directly in the pixels of the image sensor. The analog pixel voltage may then be transferred to the output terminals through various pixel addressing and scanning schemes. The analog signal may also be converted on-chip to a digital equivalent before reaching the chip output. The pixels may have a source follower (SF), which may drive the sense lines that are connected to the pixels using suitable addressing transistors.

After charge to voltage conversion is completed and the resulting signal transferred out from the pixels, the pixels of image sensor 14 may be reset in order to be ready to accumulate new charge. In certain embodiments, pixels may use a floating diffusion region (FD) as a charge detection node. When a floating diffusion node is used, the reset may be accomplished by turning on a reset transistor that conductively connects the FD node to a voltage reference, which may be the pixel SF drain node. This step removes collected charge from the floating diffusion node. However, it may generate kTC-reset noise. This kTC-reset noise may be removed from the signal using a Correlated Double Sampling (CDS) signal processing technique in order to achieve low noise performance.

Image sensor 14 may be formed with one or more substrate layers. The substrate layers may be layers of semiconductor material such as silicon. The substrate layers may be connected using metal interconnects. An example is shown in FIG. 4 in which substrates 41, 43, and 45 are used to form image sensor 14. Substrates 41, 43 and 45 may sometimes be referred to as chips. Upper chip 41 may contain the pinned photodiodes in pixel array 32. Charge transferring transistor gates may also be included in upper chip 41. However, to ensure that there is adequate room for the photodiodes in upper chip 41, much of the pixel circuitry for the pixels may be formed in middle chip 43 and lower chip 45.

Middle chip 43 may be bonded to upper chip 41 with an interconnect layer at every pixel. For example, pixel circuitry 34 in middle chip 43 may be bonded to a Floating Diffusion (FD) that is connected to a charge transfer transistor formed in upper chip 41. Bonding each pixel in upper chip 41 to corresponding pixel circuitry in middle chip 43 (e.g., floating diffusion to floating diffusion) may be referred to as hybrid bonding. Middle chip 43 and lower chip 45 may not be coupled with hybrid bonding. Only peripheral electrical contact pads 36 of each chip may be bonded together (e.g., chip-to-chip connections 38). Each chip in image sensor 14 may include relevant circuitry. The upper chip may contain pinned photodiodes and charge transferring transistor gates. The middle chip may include pixel circuitry (e.g., floating diffusion node, source follower transistor, reset transistor etc.). The bottom chip may include one or more of clock generating circuits, pixel addressing circuits, signal processing circuits such as the CDS circuits, analog to digital converter circuits, digital image processing circuits, and system interface circuits. These examples are merely illustrative and each chip may include any desired circuitry. For example, both substrates 41 and 43 may include photodiodes if desired.

Figure 5:
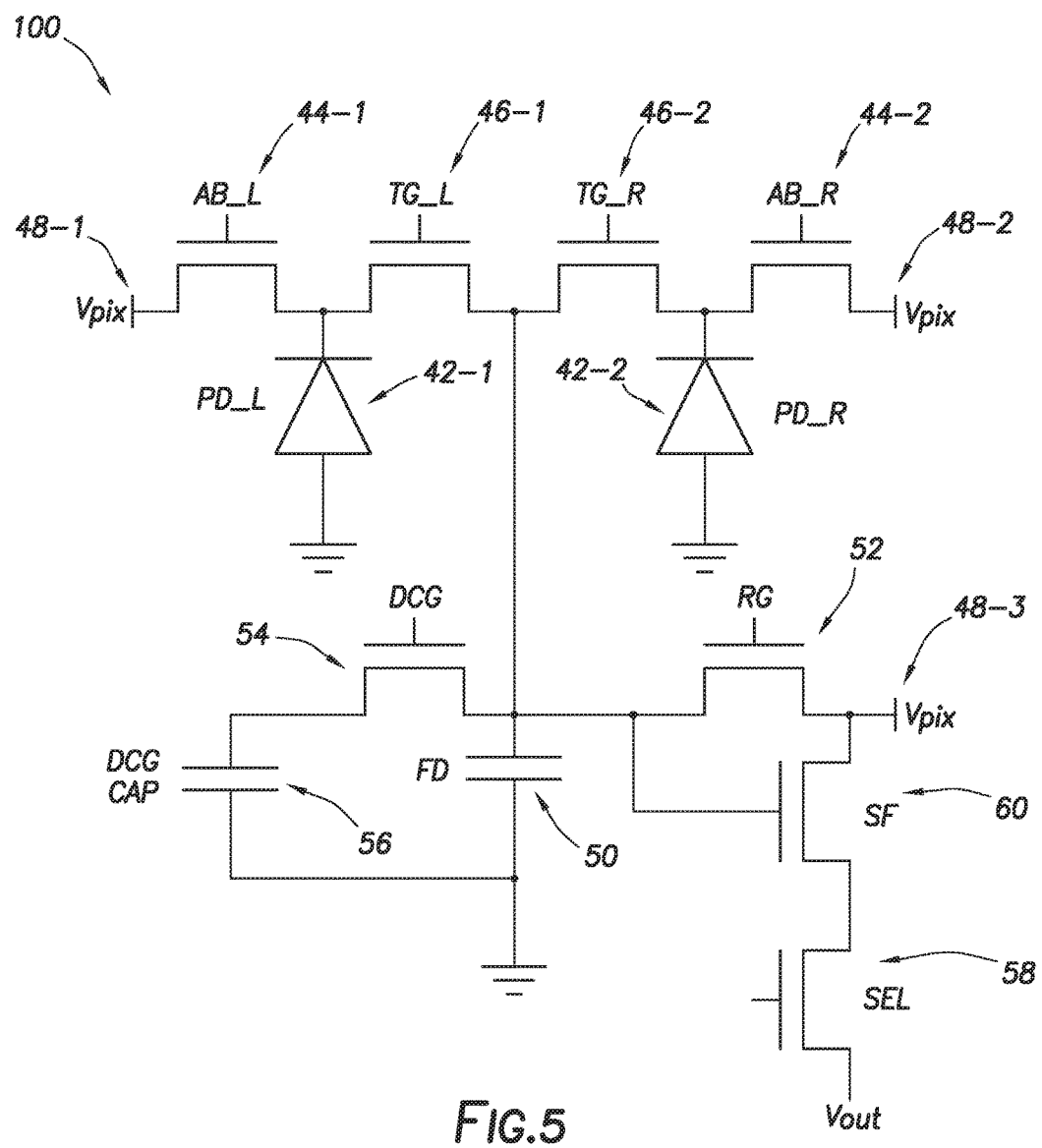
FIG. 5 is a circuit diagram of an illustrative phase detection pixel pair without time-of-flight functionality in accordance with an embodiment of the present invention.

FIG. 5 is a circuit diagram of an illustrative phase detection pixel pair 100. As shown in FIG. 5, phase detection pixel pair 100 may include two photodiodes that share readout circuitry. The first photodiode 42-1 may sometimes be referred to as the left photodiode (PD_L). The second photodiode 42-2 may sometimes be referred to as the right photodiode (PD_R). Each photodiode may be coupled to a respective transfer gate and anti-blooming gate. Photodiode 42-1 may be selectively coupled to bias voltage supply terminal 48-1 by anti-blooming transistor 44-1. When the anti-blooming transistor 44-1 (AB_L) is asserted, photodiode 42-1 may be coupled to bias voltage supply terminal 48-1, preventing charge from accumulating in the photodiode. Bias voltage supply terminal 48-1 may provide any desired bias voltage ($V_{pix}$). Transfer transistor 46-1 (TG_L) may couple photodiode 42-1 to floating diffusion region 50. When transfer transistor 46-1 is asserted, charge from photodiode 42-1 may be transferred to the floating diffusion region.

Photodiode 42-2 may be selectively coupled to bias voltage supply terminal 48-2 by anti-blooming transistor 44-2. When the anti-blooming transistor 44-2 (AB_R) is asserted, photodiode 42-2 may be coupled to bias voltage supply terminal 48-2, preventing charge from accumulating in the photodiode. Bias voltage supply terminal 48-2 may provide any desired bias voltage ($V_{pix}$). Transfer transistor 46-2 (TG_R) may couple photodiode 42-2 to floating diffusion region 50. When transfer transistor 46-2 is asserted, charge from photodiode 42-2 may be transferred to the floating diffusion region.

Floating diffusion region 50 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiodes 42-1 and 42-2. Floating diffusion region 50 may be coupled to bias voltage supply terminal 48-3 by reset transistor 52.

Dual conversion gain transistor 54 may have a gate terminal that is controlled using dual conversion gain signal DCG. The phase detection pixels may be operable in a high conversion gain mode and in a low conversion gain mode. If transistor 54 is disabled (e.g., if signal DCG is low), the pixels are placed in the high conversion gain mode. If transistor 54 is enabled (e.g., if signal DCG is high), the pixels are placed in the low conversion gain mode.

In general, pixel conversion gain is inversely proportional to the amount of loading capacitance at the floating diffusion node FD. When transistor 54 is turned on, dual conversion gain capacitor 56 (DCG Cap) is switched into use in order to provide shared floating diffusion node 50 with additional capacitance (e.g., additional charge storage capacity). This results in a lower conversion gain for the phase detection pixels. When transistor 54 is turned off, the additional loading of capacitor 56 is removed and the pixels revert to a relatively higher pixel conversion gain configuration. If desired, the pixels may be operated in high conversion gain mode (e.g., transistor 54 may be turned off) when operating in a high resolution mode and may be operated in low conversion gain mode (e.g., transistor 54 may be turned on) when operating in a low resolution mode.

The signal associated with the stored charge on floating diffusion node 50 is conveyed to row select transistor 58 (SEL) by source-follower transistor 60 (SF). When operating the pixels of phase detection pixel pair 100, the reset transistor may be turned on to reset the floating diffusion region 50. After the reset process is complete, transfer gate 46-1 or 46-2 may be turned on. When one of the transfer transistors is turned on, the charge that has been generated by the corresponding photodiode (i.e., 42-1 or 42-2) in response to incoming light is transferred to shared charge storage node 50. Transfer gates 46-1 and 46-2 may be pulsed once to perform one charge transfer operation or may be pulsed multiple times to perform multiple charge transfer operations (e.g., to extend the effective charge well capacity of the corresponding photodiodes). When it is desired to read out the value of the stored charge (i.e., the value of the stored charge that is represented by the signal at the source of transistor 60), row select control signal SEL may be asserted. When signal SEL is asserted, transistor 58 turns on and a corresponding image signal $V_{OUT}$ that is representative of the magnitude of the charge on shared charge storage node 50 (e.g., a reset-level or an image-level voltage from one or more photodiodes) is produced.

Figure 6:
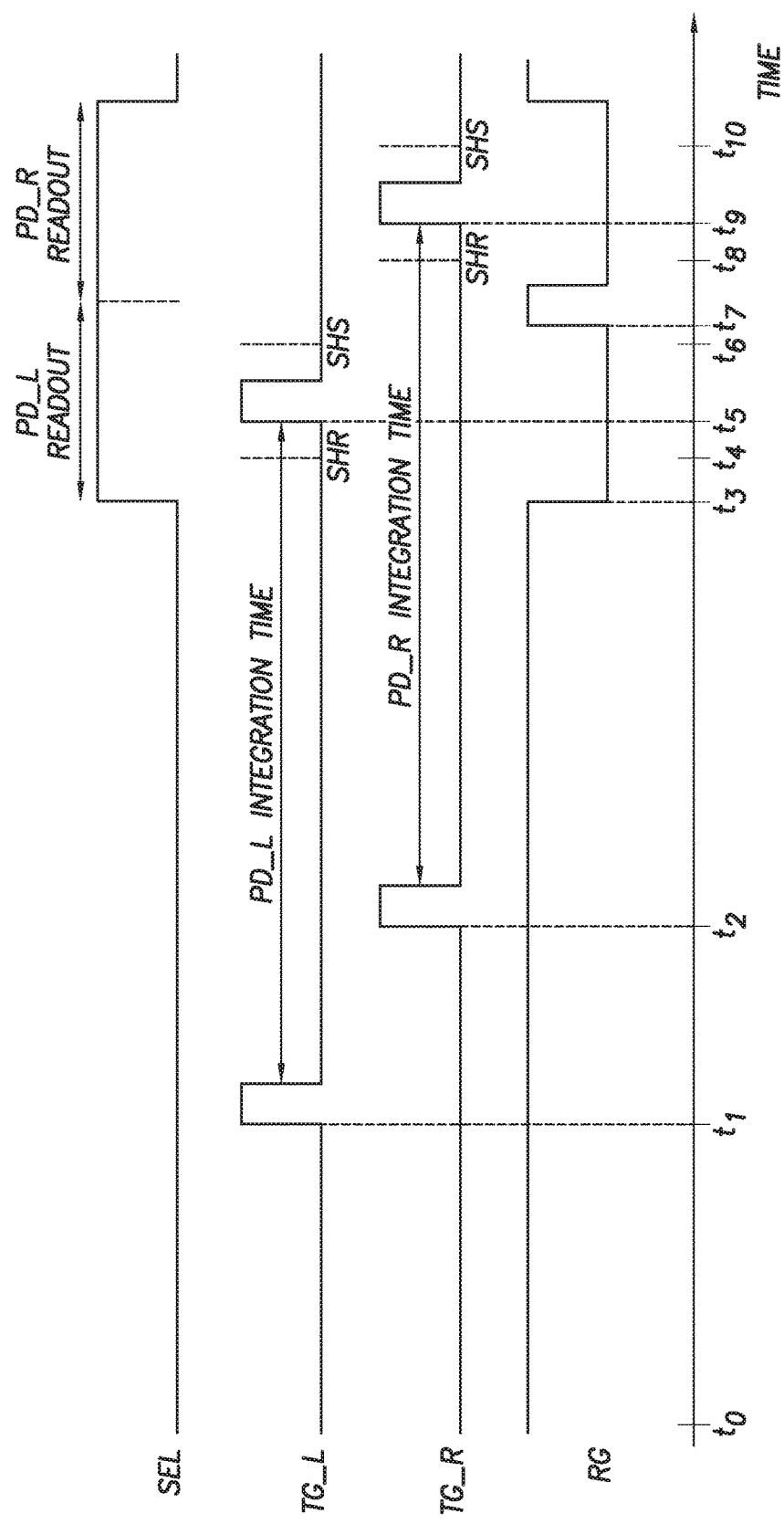
FIG. 6 is a timing diagram showing the operation of the phase detection pixel pair of FIG. 5 in accordance with an embodiment of the present invention.

FIG. 6 is a timing diagram showing the operation of phase detection pixel pair 100 from FIG. 5. As shown, at $t_0$ the reset transistor RG may be asserted. Asserting reset transistor RG may reset floating diffusion 50 to a baseline value. At $t_1$, transfer transistor TG_L may be asserted. Asserting transfer transistor TG_L (while reset transfer RG is asserted) may clear any accumulated charge from photodiode 42-1 (PD_L). Similarly, at $t_2$, transfer transistor TG_R may be asserted. Asserting transfer transistor TG_R (while reset transfer RG is asserted) may clear any accumulated charge from photodiode 42-2 (PD_R). After TG_L is asserted at $t_1$, charge may begin accumulating in PD_L during the PD_L integration time. After TG_R is asserted at $t_2$, charge may begin accumulating in PD_R during the PD_R integration time. At $t_3$, the reset transistor may be turned off, the row select transistor may be turned on, and the PD_L readout period may begin. After RG is deasserted, the reset level of the floating diffusion region may be sampled at $t_4$ by asserting the sample and hold reset signal (SHR). Charge from PD_L may subsequently be transferred to floating diffusion region 50 by asserting TG_L at $t_5$. After TG_L is asserted at $t_5$, the amount of charge in the floating diffusion region (i.e., the sample from the integration time) may be sampled by asserting the sample and hold signal (SHS) at $t_6$.

After the charge from PD_L is read out, the PD_R readout may occur. At $t_7$ RG may be asserted to reset floating diffusion region 50 to a baseline level. After RG is deasserted, the reset level of the floating diffusion region may be sampled at $t_8$ by asserting the sample and hold reset signal (SHR). Charge from PD_R may subsequently be transferred to floating diffusion region 50 by asserting TG_R at $t_9$. After TG_R is asserted at $t_9$, the amount of charge in the floating diffusion region (i.e., the sample from the integration time) may be sampled by asserting the sample and hold signal (SHS) at $t_{10}$.

The PD_L integration time may occur between the reset of PD_L and the transfer of charge from PD_L to the floating diffusion region (i.e., between $t_1$ and $t_5$). The PD_R integration time may occur between the reset of PD_R and the transfer of charge from PD_R to the floating diffusion region (i.e., between $t_2$ and $t_7$). In FIG. 6, the floating diffusion region is sampled before and after charge transfer in a correlated double sampling readout. Correlated double sampling (CDS) is used to correct for noise in imaging pixels. Voltage at the floating diffusion region may be sampled to determine the amount of incident light exposure for the imaging pixel. Ideally, all of the voltage at the floating diffusion region would be associated with the incident light. However, in reality, this is not the case and some of the voltage will be present due to noise. In order to isolate the voltage that comes from the incident light, correlated double sampling compares the reset voltage level at the FD to the sample voltage level at the FD. The reset voltage level is the amount of voltage that comes from noise, while the sample voltage level includes voltage from noise and incident light.

The reset voltage level may be subtracted from the sample voltage level to isolate the amount of voltage associated with the incident light.

Figure 9:
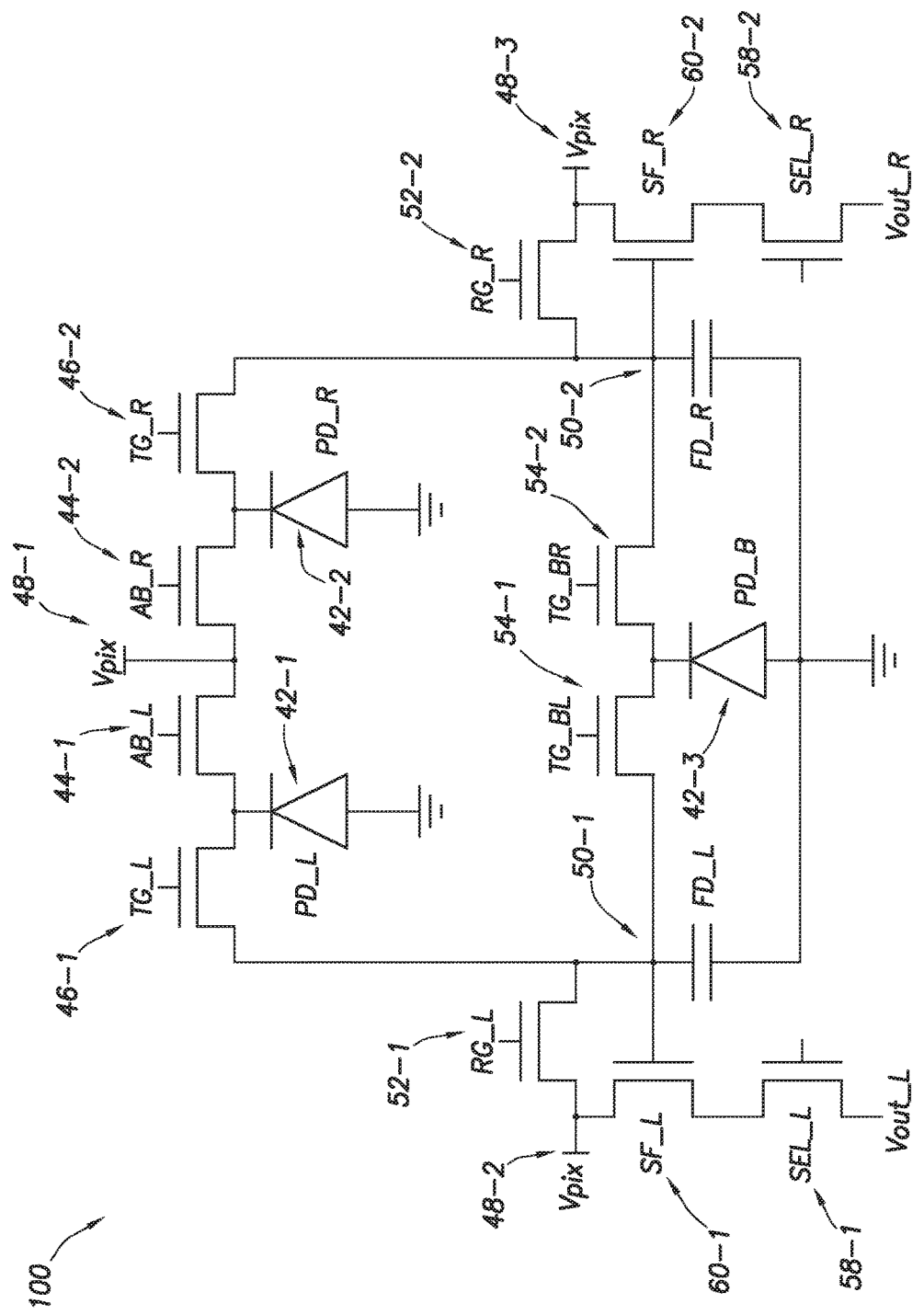
FIG. 9 is a circuit diagram of an illustrative hybrid three-dimensional imaging pixel group with phase detection and time-of-flight functionality in accordance with an embodiment of the present invention.

As shown in FIG. 6, because PD_L and PD_R share floating diffusion region 50, readout of PD_L and PD_R must be performed sequentially. In the example of FIG. 6, readout of PD_R cannot begin until readout of PD_L concludes. This undesirably prolongs the length of the readout period (and accordingly, decreases the maximum framerate of the image sensor). In order to shorten the length of the readout period, each photodiode in phase detection pixel pair 100 may have a respective floating diffusion region. An embodiment of this type is shown in FIG. 9. Additionally, the performance of phase detection pixel pair 100 of FIG. 5 may be limited in some circumstances. For example, with insufficient background light the performance of phase detection pixel pair 100 may be limited. Similarly, if the scene being imaged lacks texture, the phase detection performance may be reduced. To help ensure robust and high quality three-dimensional imaging, pixel group 100 may include time-of-flight functionality.

Figure 7A:
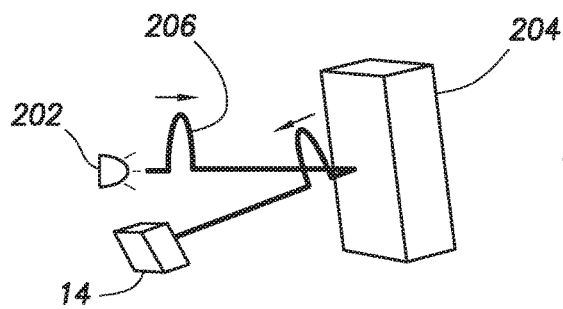
FIGS. 7A and 7B are perspective views of time-of-flight imaging systems that may be used for three-dimensional imaging in accordance with an embodiment of the present invention.
Figure 7B:
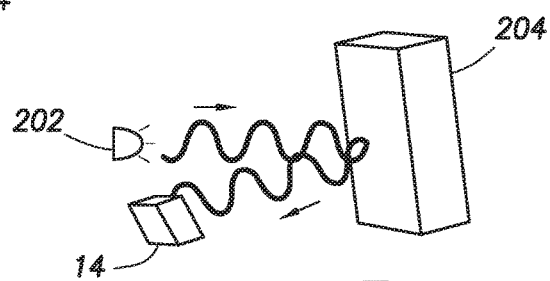

FIGS. 7A and 7B are perspective views illustrating the principles of a time-of-flight imaging system. As shown in FIG. 7A, light source 202 may emit a pulse of light 206. The pulse of light may reflect off of an external object 204 and be detected by image sensor 14. The length of time between the emission of the pulse of light by light source 202 and the detection of the pulse of light by image sensor 14 may be used to determine the distance between the external object 204 and the image sensor 14. Light source 202 may emit any desired type of light (i.e., visible light, infrared light, ultraviolet light, etc.). If desired, as shown in FIG. 7B, light source 202 may emit light that modulates with a predetermined frequency. After reflecting off of external object 204, the light received by image sensor 14 may have the same pattern as the emitted light but with a phase delay. The phase delay can be used to help determine the distance to external object 204.

Figure 8A:
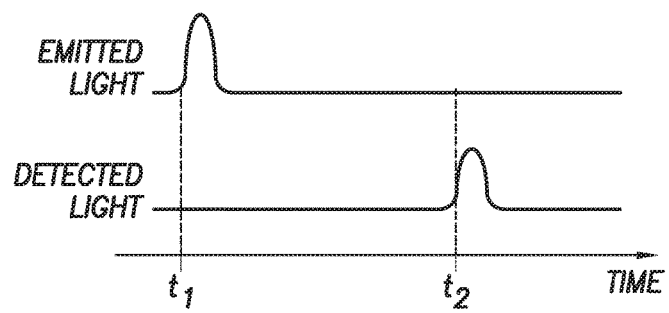
FIGS. 8A and 8B are timing diagrams showing the signals sent and received by a time-of-flight imaging system in accordance with an embodiment of the present invention.
Figure 8B:
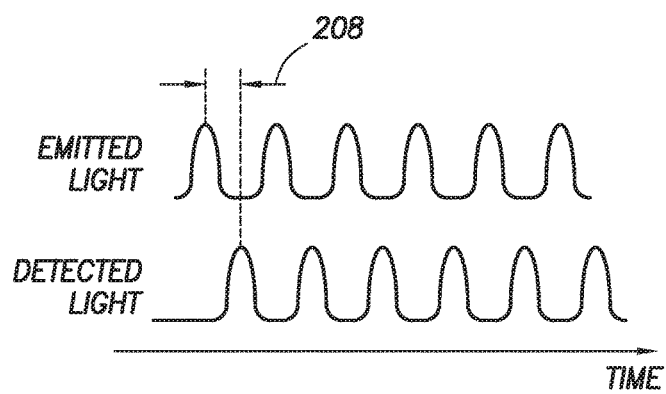

FIGS. 8A and 8B are timing diagrams showing the signals sent and received by a time-of-flight imaging system. In FIG. 8A, a pulse of light is emitted at $t_1$. The reflected light from the external object is detected at $t_2$. The length of time between $t_1$ and $t_2$ can therefore determine the distance of the external object from the sensor. In FIG. 8A, the emitted light may be modulated in a pattern. The detected light may exhibit the same pattern, but with phase delay 208. Phase delay 208 may be used to help determine the distance of the external object from the sensor.

In general, any type of light may be emitted in any type of pattern to obtain time-of-flight information. In one illustrative example, near infrared (NIR) light may be used as the light source. The light emitted from the light source may have a wavelength of between 700 nm to 800 nm, between 700 nm and 2400 nm, greater than 700 nm, or any other desired wavelength. The light may be modulated at any desired frequency (e.g., 20 MHz, less than 20 MHz, greater than 20 MHz, between 10 and 30 MHz, between 1 and 200 MHz, etc.).

FIG. 9 is a circuit diagram of an illustrative three-dimensional imaging pixel group 100. As shown in FIG. 9, three-dimensional imaging pixel group 100 may include two photodiodes that each have respective floating diffusion regions. These two photodiodes may be used to obtain phase detection pixel information. The pixel group may also include an additional photodiode that is used to obtain time-of-flight information. The first photodiode 42-1 may sometimes be referred to as the left photodiode (PD_L). The second photodiode 42-2 may sometimes be referred to as the right photodiode (PD_R). The third photodiode 42-3 may sometimes be referred to as the bottom photodiode (PD_B). Photodiodes 42-1 and 42-2 may be coupled to a respective transfer gate and anti-blooming gate. Photodiode 42-1 may be selectively coupled to bias voltage supply terminal 48-1 by anti-blooming transistor 44-1. When the anti-blooming transistor 44-1 (AB_L) is asserted, photodiode 42-1 may be coupled to bias voltage supply terminal 48-1, preventing charge from accumulating in the photodiode. Bias voltage supply terminal 48-1 may provide any desired bias voltage ($V_{pix}$). Transfer transistor 46-1 (TG_L) may couple photodiode 42-1 to floating diffusion region 50-1 (FD_L). When transfer transistor 46-1 is asserted, charge from photodiode 42-1 may be transferred to floating diffusion region 50-1.

Photodiode 42-2 may be selectively coupled to bias voltage supply terminal 48-1 by anti-blooming transistor 44-2. When the anti-blooming transistor 44-2 (AB_R) is asserted, photodiode 42-2 may be coupled to bias voltage supply terminal 48-1, preventing charge from accumulating in the photodiode. Transfer transistor 46-2 (TG_R) may couple photodiode 42-2 to floating diffusion region 50-2 (FD_R). When transfer transistor 46-2 is asserted, charge from photodiode 42-2 may be transferred to floating diffusion region 50-2. It should be noted that the embodiments of FIGS. 9 and 10 where bias voltage supply terminal 48-1 is shared between photodiodes 42-1 and 42-2 is merely illustrative. If desired, each photodiode may have a respective bias voltage supply terminal.

Each floating diffusion region may be coupled to a bias voltage supply terminal by a reset transistor. Floating diffusion region 50-1 may be coupled to bias voltage supply terminal 48-2 by reset gate 52-1 (RG_L). Floating diffusion region 50-2 may be coupled to bias voltage supply terminal 48-3 by reset gate 52-2 (RG_R). Each floating diffusion region may have corresponding readout circuitry. The signal associated with the stored charge on floating diffusion node 50-1 may be conveyed to row select transistor 58-1 (SEL_L) by source-follower transistor 60-1 (SF_L). The signal associated with the stored charge on floating diffusion node 50-2 may be conveyed to row select transistor 58-2 (SEL_R) by source-follower transistor 60-2 (SF_R). When signal SEL_L is asserted, transistor 58-1 turns on and a corresponding image signal $V_{OUT\_L}$ that is representative of the magnitude of the charge on shared charge storage node 50-1 is produced. When signal SEL_R is asserted, transistor 58-2 turns on and a corresponding image signal $V_{OUT\_R}$ that is representative of the magnitude of the charge on shared charge storage node 50-2 is produced.

Three-dimensional imaging pixel group 100 may also include a third photodiode 42-3. This photodiode may be used to obtain time-of-flight information. Photodiode 42-3 may alternately transfer accumulated charge to either floating diffusion 50-1 or floating diffusion 50-2. As shown, a first transfer transistor (TG_BL) may be interposed between photodiode 42-3 and floating diffusion region 50-1. A second transfer transistor (TG_BR) may be interposed between photodiode 42-3 and floating diffusion region 50-2. When TG_BL is asserted, charge accumulated in photodiode 42-3 may be transferred to floating diffusion region 50-1. When TG_BR is asserted, charge accumulated in photodiode 42-3 may be transferred to floating diffusion region 50-2.

Figure 10:
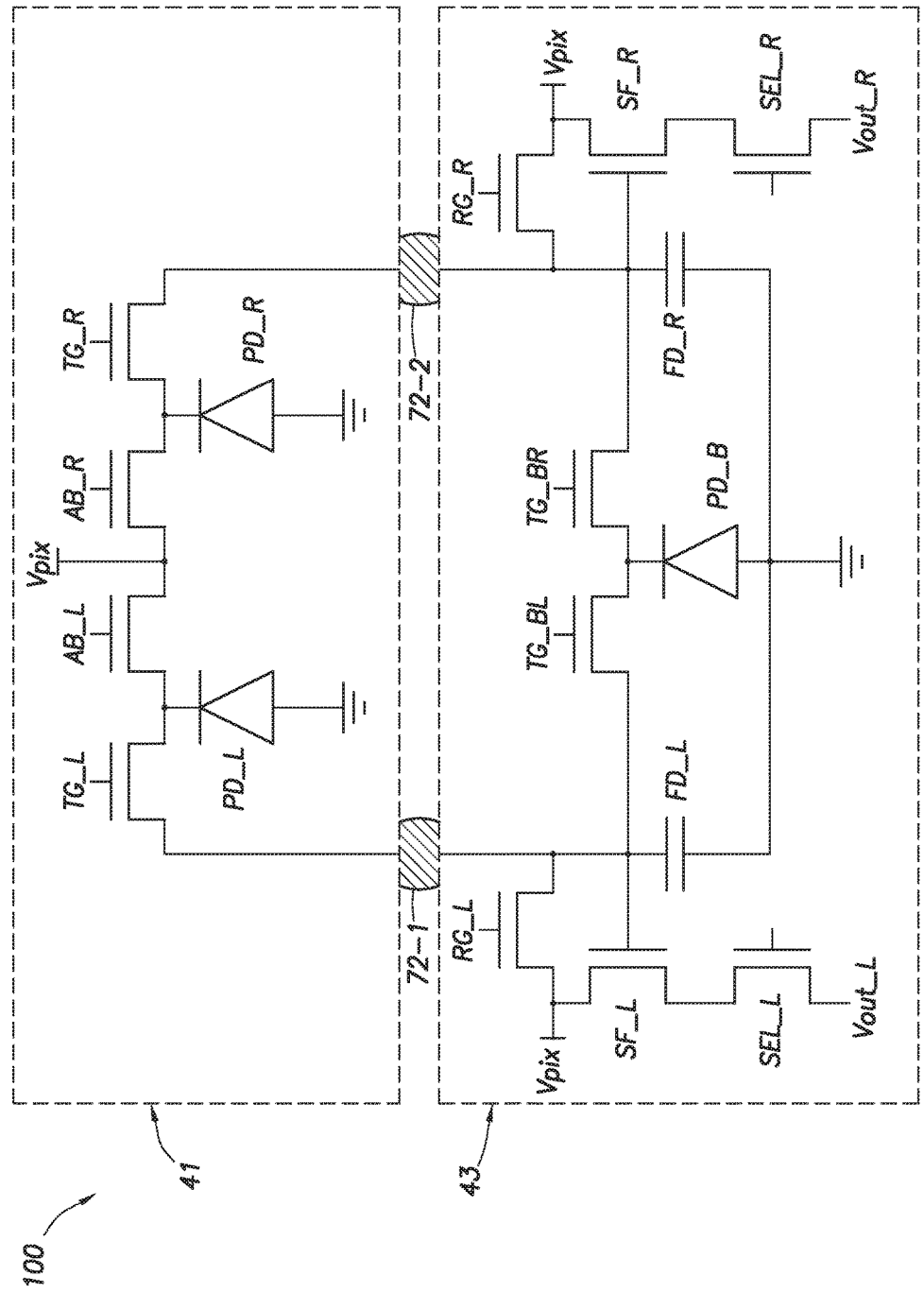
FIG. 10 is a circuit diagram of an illustrative hybrid three-dimensional imaging pixel group with phase detection and time-of-flight functionality that is split between multiple substrates in accordance with an embodiment of the present invention.

A three-dimensional imaging pixel group with two phase detection photodiodes and one time-of-flight photodiode may be implemented using stacked substrates as shown in FIG. 10. The pixel group in FIG. 10 may be the same as the pixel pair in FIG. 9 except implemented in multiple substrates. Substrate 41 may include the phase detection photodiodes (PD_L and PD_R), the transfer transistors (TG_L and TG_R), and the anti-blooming transistors (AB_L and AB_R). Other pixel circuitry such as the floating diffusion regions (FD_L and FD_R), the reset transistors (RG_L and RG_R), the source follower transistors (SF_L and SF_R), and the row select transistors (SEL_L and SEL_R) may be formed in substrate 43. Substrate 43 may also include time-of-flight photodiode 42-3 and the associated transfer transistors TG_BL and TG_BR. Substrates 41 and 43 may be coupled with interconnect layers 72. Interconnect layers 72 may be formed from a conductive material such as metal (e.g., copper). In certain embodiments, the interconnect layer may include solder. The interconnect layer may also be a through silicon via (TSV).

In FIG. 10, a first interconnect layer 72-1 is shown as being interposed between transfer gate TG_L and floating diffusion region FD_L and a second interconnect layer 72-2 is shown as being interposed between transfer gate TG_R and floating diffusion region FD_R. This example is merely illustrative and the interconnect layers may be interposed at any desired point within the pixel circuit (e.g., between the floating diffusion region and the source follower transistor, between the source follower transistor and the row select transistor, etc.). Additionally, in certain embodiments, interconnect layers may be formed at additional points within the circuit (e.g., between the floating diffusion region and the reset transistor, between the floating diffusion region and the time-of-flight photodiode, etc.). The circuitry associated with photodiode PD_L may be the same as the circuitry associated with PD_R (as shown in FIG. 10). Alternatively, if desired each photodiode may have different circuitry or interconnect layers implemented in different positions.

Although not explicitly shown in FIGS. 9 and 10, hybrid three-dimensional imaging pixel groups of the type shown in FIGS. 9 and 10 may include dual conversion gain capacitors and corresponding dual conversion gain transistors (similar to as shown in FIG. 5, for example).

There are numerous benefits of the pixel group structure shown in FIG. 10 (compared to the structure shown in FIG. 5). First of all, the additional time-of-flight photodiode may improve three-dimensional imaging performance by enabling three-dimensional imaging even in low light conditions or other conditions poor for phase detection. Additionally, each phase detection photodiode in FIG. 10 has a respective floating diffusion region. This allows readout from the phase detection photodiodes in parallel (as opposed to FIG. 5 where the photodiodes must be readout sequentially as shown in FIG. 6). Yet another benefit to the structure shown in FIG. 10 is that splitting the pixel group between multiple substrates allows more substrate area to be designated to the photodiodes (improving pixel performance).

Figure 11:
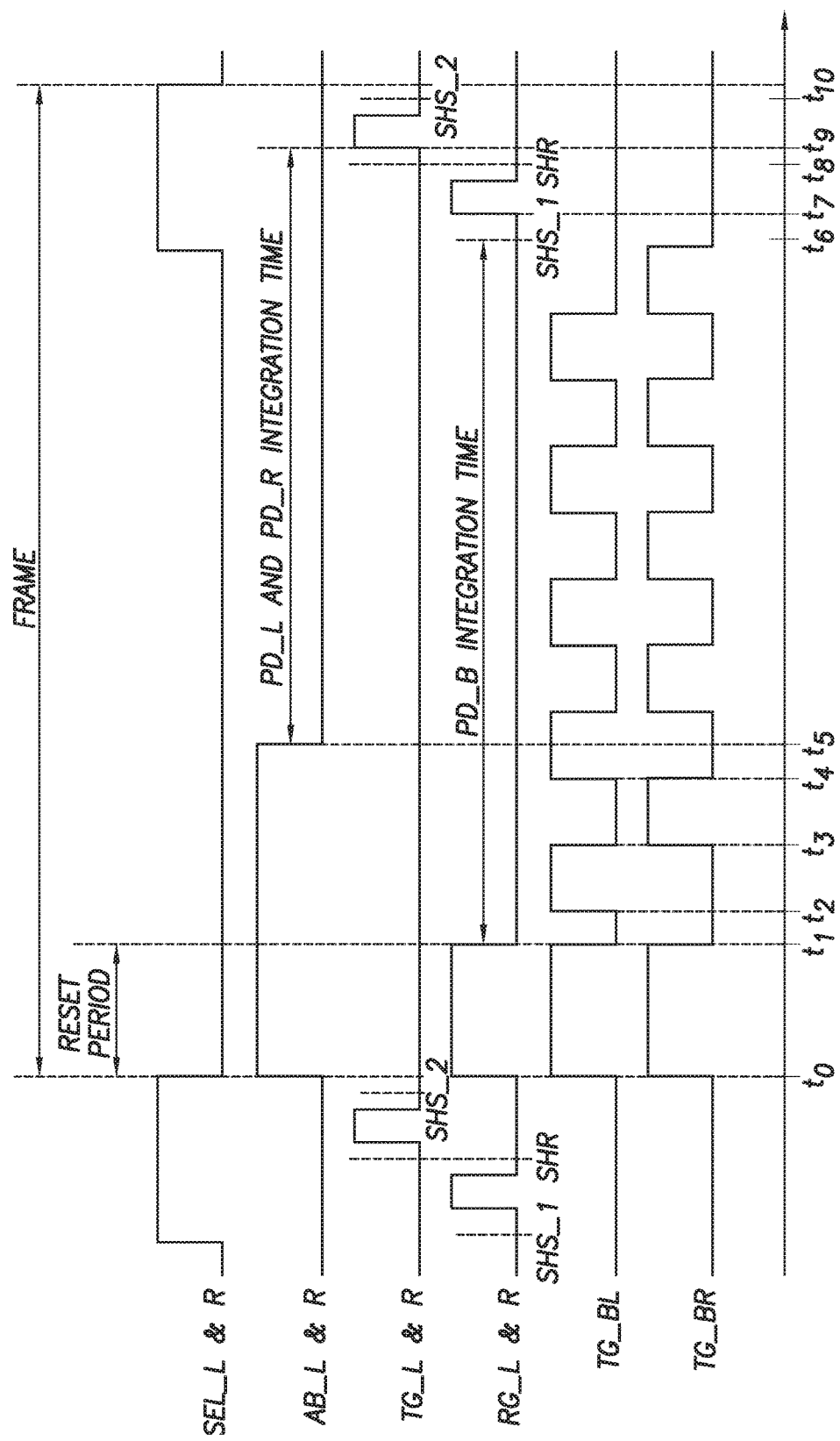
FIG. 11 is a timing diagram showing the operation of the hybrid three-dimensional imaging pixel group shown in FIG. 9 or FIG. 10 in accordance with an embodiment of the present invention.

FIG. 11 is a timing diagram showing the operation of the hybrid three-dimensional imaging pixel group shown in FIGS. 9 and 10. The frame may begin at $t_0$. At $t_0$, anti-blooming transistors AB_L and AB_R, reset transistors RG_L and RG_R, and lower transfer transistors TG_BL and TG_BR may all be asserted. Asserting this combination of transistors may clear charge from all photodiodes and floating diffusion regions in the pixel group. When anti-blooming transistor AB_L is asserted, charge may be cleared from PD_L. When anti-blooming transistor AB_R is asserted, charge may be cleared from PD_R. Asserting reset transistor RG_L clears floating diffusion region FD_L of charge and asserting reset transistor RG_R clears floating diffusion region FD_R of charge. Asserting transfer transistors TG_BL and TG_BR transfers any charge from photodiode PD_B to floating diffusion regions FD_L and FD_R (which are reset by the reset transistors). Therefore photodiodes PD_L, PD_R, and PD_B and floating diffusion regions FD_L and FD_R are reset during the reset period (i.e., between $t_0$ and $t_1$).

At $t_1$, reset transistors RG_L and RG_R may be deasserted, allowing floating diffusion regions FD_L and FD_R to retain charge. The integration time for photodiode PD_B may begin at $t_1$. In order for photodiode PD_B to obtain time-of-flight information, charge from the photodiode may be alternately transferred to floating diffusion regions FD_L and FD_R. For example, at $t_2$ transfer transistor TG_BL may be asserted and charge from photodiode PD_B may be transferred to floating diffusion region FD_L. Any charge generated by photodiode PD_B may be transferred to floating diffusion region FD_L until transfer transistor TG_BL is turned off at $t_3$. When transfer transistor TG_BL is turned off, transfer transistor TG_BR may be turned on. Therefore, at $t_3$ any charge generated by photodiode PD_B will be transferred to floating diffusion region FD_R. At $t_4$, TG_BR may turned off and TG_BL may be turned back on. This pattern may continue throughout the PD_B integration time. The frequency with which transfer transistors TG_BL and TG_BR are turned on and off during the PD_B integration time may be correlated to the frequency of the light emitted by the light source for the time-of-flight system. The timing of transfer transistors TG_BL and TG_BR being turned on and off may be synchronized with the time-of-flight light source in the imaging system. The aforementioned example of a scheme for obtaining time-of-flight information is merely illustrative. Photodiode PD_B may be used as a photodiode in any desired type of time-of-flight pixel with any desired sampling or readout scheme.

At $t_6$, the voltage of floating diffusion regions FD_L and FD_R may be sampled by asserting sample and hold signal SHS_1. The voltage sampled in FD_L may reflect the amount of charge transferred to FD_L from photodiode PD_B, while the voltage sampled in FD_R may reflect the amount of charge transferred to FD_R from photodiode PD_B. Importantly, at $t_6$ the voltage of the floating diffusion regions will not be influenced by the charge accumulated in photodiodes PD_L and PD_R. Therefore, the data obtained at $t_6$ is only time-of-flight data from PD_B. After sampling the data in FD_L and FD_R at $t_6$, reset transistors RG_L and RG_R may be asserted at $t_7$. This may reset floating diffusion regions FD_L and FD_R. The reset level of FD_L and FD_R may then be sampled by asserting sample and hold reset signal SHR at $t_8$. The reset charge level may then be used in combination with the sample charge level from the floating diffusion regions in a double sampling calculation (i.e., the reset level of FD_L at $t_8$ may be subtracted from the sample level of FD_L at $t_6$ and the reset level of FD_R at $t_8$ may be subtracted from the sample level of FD_R at $t_6$).

Correlated double sampling involves sampling the reset level of the floating diffusion region before sampling the sample level. In this case, the reset level is being sampled after sampling the sample level. The present calculation is therefore not a true correlated double sampling calculation. This type of calculation may sometimes be referred to as an uncorrelated double sampling calculation. Although not as accurate as a true correlated double sampling calculation, the uncorrelated double sampling scheme for the time-of-flight information in FIG. 11 may have significantly less noise than if no double sampling of any kind was performed.

After the reset level of the floating diffusion regions is sampled at $t_8$, no more information is obtained from the time-of-flight photodiode in the frame. In the remaining portion of the frame, the phase detection information from photodiodes PD_L and PD_R is read out. Charge may be transferred from photodiodes PD_L and PD_R to floating diffusion regions FD_L and FD_R by asserting transfer transistors TG_L and TG_R at $t_9$. Previously, at $t_5$, anti-blooming transistors AB_L and AB_R may have been deasserted, allowing photodiodes PD_L and PD_R to accumulate charge. The integration time of photodiodes PD_L and PD_R may therefore be determined by the time of the deassertion of anti-blooming transistors AB_L and AB_R. In FIG. 11, AB_L and AB_R are deasserted at $t_5$ and the integration times of PD_L and PD_R are between $t_5$ and $t_9$. However, if a longer integration time is desired for the phase detection photodiodes, anti-blooming transistors AB_L and AB_R may be deasserted closer to $t_0$. If a shorter integration time is desired for the phase detection photodiodes, anti-blooming transistors AB_L and AB_R may be deasserted closer to $t_9$. In general, any desired integration times may be used.

After the charge from photodiodes PD_L and PD_R is transferred to floating diffusion regions FD_L and FD_R at $t_9$, the voltage level of floating diffusion regions FD_L and FD_R may be sampled by asserting sample and hold signal SHS_2. The reset level of the floating diffusion regions (which was previously obtained at $t_8$) may be used in a correlated double sampling calculation to determine the amount of charge generated by photodiodes PD_L and PD_R. It should be noted that the reset voltage sample for FD_L and FD_R obtained at $t_8$ therefore is used in double sampling calculations for both the time-of-flight and phase detection information. For the time-of-flight information, the reset level at $t_8$ is used with the sample obtained at $t_6$ in an uncorrelated double sampling calculation. For the phase detection information, the reset level at $t_8$ is used with the sample obtained at $t_{10}$ in a correlated double sampling calculation.

FIG. 11 demonstrates how pixel group 100 in FIG. 9 or FIG. 10 may be used to obtain phase detection information and time-of-flight information in a single frame. In particular, photodiodes PD_L and PD_R may be used to obtain phase detection information, whereas photodiode PD_B may be used to obtain time-of-flight information. Photodiode PD_L may transfer charge to floating diffusion region FD_L for readout, photodiode PD_R may transfer charge to floating diffusion region FD_R for readout, and photodiode PD_B may transfer charge to floating diffusion regions FD_L and FD_R for readout. The readout sequence may be performed in such a way that the information from each photodiode is read out independently. The PD_B readout may occur first, followed by a reset level sampling that is used for double sampling with the PD_B readout. The same reset level may then be used for correlated double sampling with a subsequent PD_L a PD_R readout.

Figure 12:
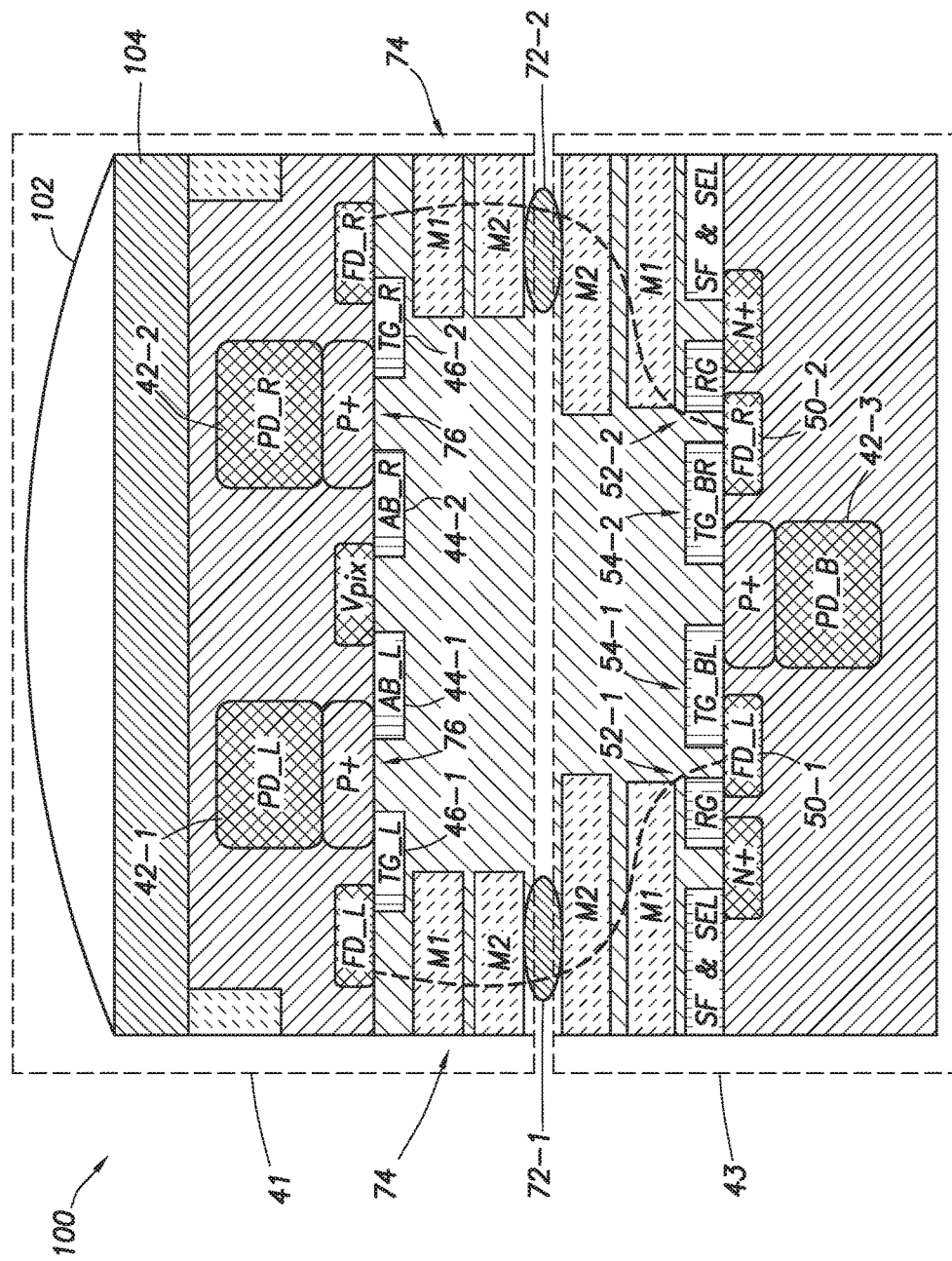
FIG. 12 is a cross-sectional side view of an illustrative hybrid three-dimensional imaging pixel group with phase detection and time-of-flight functionality in accordance with an embodiment of the present invention.

FIG. 12 is a cross-sectional side view of a hybrid three-dimensional imaging pixel group where the pixels are implemented in stacked substrates (similar to as discussed in connection with FIG. 10). As shown in FIG. 12, the pixel group may include substrate 41 and substrate 43. Microlens 102 and color filter 104 may cover photodiodes 42-1, 42-2, and 42-3. Photodiodes PD_L and PD_R may be offset from the center of microlens 102 (as shown in FIGS. 2A-2C) so that PD_L and PD_R have asymmetric responses to incident light. Photodiode PD_B may be positioned under the center of microlens 102 such that PD_B has a symmetric response to incident light. Similar to as shown in the circuit diagram of FIG. 10, interconnect layers 72-1 and 72-2 may connect the upper substrate to the lower substrate. Additional metal interconnect layers 74 may help form the connection between substrates.

P+ pinning layers 76 may be formed beneath each photodiode. Anti-blooming transistor 44-1 may be interposed between photodiode 42-1 and bias voltage region $V_{pix}$. Transfer transistor 46-1 may be interposed between photodiode 42-1 and floating diffusion region 50-1. As shown in FIG. 12, floating diffusion region 50-1 may include a first doped semiconductor region in substrate 41 and a second doped semiconductor region in substrate 43. When transfer transistor 46-1 is asserted charge from photodiode 42-1 may be transferred to FD_L in substrate 41 then travel along the dashed line through interconnect layer 72-1 to FD_L in substrate 43.

Anti-blooming transistor 44-2 may be interposed between photodiode 42-2 and bias voltage region $V_{pix}$. Transfer transistor 46-2 may be interposed between photodiode 42-2 and floating diffusion region 50-2. As shown in FIG. 12, floating diffusion region 50-2 may include a first doped semiconductor region in substrate 41 and a second doped semiconductor region in substrate 43. When transfer transistor 46-2 is asserted charge from photodiode 42-2 may be transferred to FD_R in substrate 41 then travel along the dashed line through interconnect layer 72-2 to FD_R in substrate 43.

Reset transistor 52-1 may couple floating diffusion region 50-1 to a doped semiconductor region (N+) that is coupled to a bias voltage ($V_{pix}$). Reset transistor 52-2 may couple floating diffusion region 50-2 to a doped semiconductor region (N+) that is coupled to a bias voltage ($V_{pix}$). Unlike photodiodes 42-1 and 42-2 (which are formed in substrate 41), photodiode 42-3 may be formed in substrate 43. Transfer transistor 54-1 may be formed in substrate 43 between photodiode 42-3 and floating diffusion region FD_L. When transfer transistor 54-1 is asserted, charge may be transferred from PD_B to FD_L. Transfer transistor 54-2 may be formed in substrate 43 between photodiode 42-3 and floating diffusion region FD_R. When transfer transistor 54-2 is asserted, charge may be transferred from PD_B to FD_R.

Because photodiode PD_B is formed below photodiodes PD_L and PD_R, light that is captured by PD_R and PD_L may not reach PD_B. However, photodiode PD_B may be a time-of-flight photodiode that is used to obtain time-of-flight information. To obtain time-of-flight information, the photodiode captures reflected light from a light source as previously discussed. The light from the light source may be, for example, infrared light that penetrates deeper into the substrates. Therefore, forming photodiode PD_B below photodiodes PD_L and PD_R results in sufficient functionality of PD_B because light of the wavelength of interest for PD_B is likely to pass through the first substrate and be collected by PD_B.

Figure 13A:
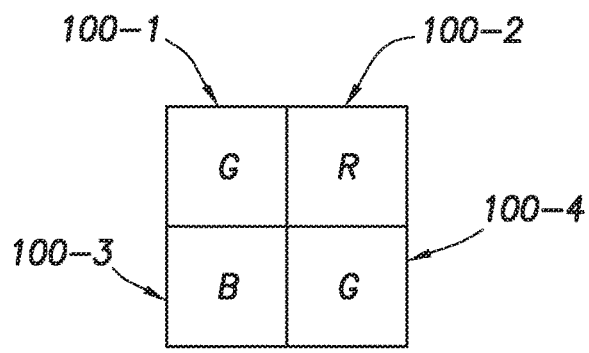
FIGS. 13A-13C are top views of illustrative color filter patterns that may be used to cover hybrid three-dimensional imaging pixel groups in accordance with an embodiment of the present invention.
Figure 13B:
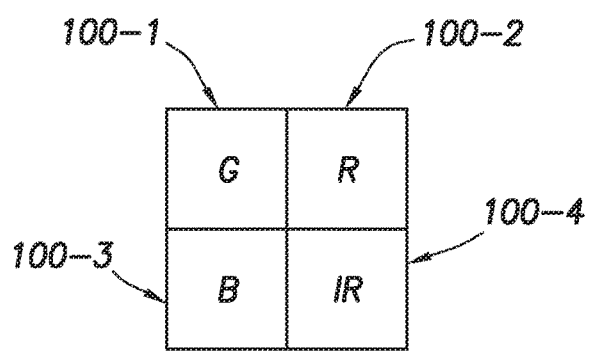
Figure 13C:
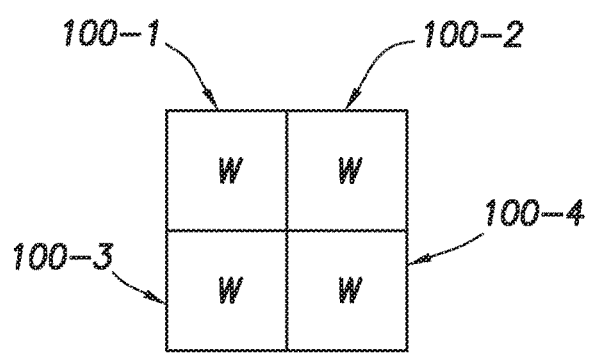

FIGS. 13A-13C show illustrative color filter patterns that may be used to cover hybrid three-dimensional imaging pixel groups. FIG. 13A shows color filter elements arranged in a Bayer mosaic pattern. The Bayer Mosaic pattern consists of a repeating cell of two-by-two color filter elements, with two green color filter elements diagonally opposite one another, and the other corners being red and blue. In FIG. 12A, red color filter elements are labeled "R", green color filter elements are labeled "Gr", and blue color filter elements are labeled "B". Each color filter element may cover a corresponding hybrid three-dimensional imaging pixel group. Hybrid three-dimensional imaging pixel group 100-1 may have a green color filter element, hybrid three-dimensional imaging pixel group 100-2 may have a red color filter element, hybrid three-dimensional imaging pixel group 100-3 may have a blue color filter element, and hybrid three-dimensional imaging pixel group 100-4 may have a green color filter element.

In FIG. 13B, the color filter pattern may be similar to the Bayer Mosaic pattern, except with an infrared color filter replacing one of the green color filters. In FIG. 13B, red color filter elements are labeled "R", green color filter elements are labeled "Gr", blue color filter elements are labeled "B", and infrared color filter elements are labeled "IR". In embodiments where the light source for the time-of-flight information emits infrared light, it may be desirable to include an infrared color filter element in the color filter pattern for improved time-of-flight information. Hybrid three-dimensional imaging pixel group 100-1 may have a green color filter element, hybrid three-dimensional imaging pixel group 100-2 may have a red color filter element, hybrid three-dimensional imaging pixel group 100-3 may have a blue color filter element, and hybrid three-dimensional imaging pixel group 100-4 may have an infrared color filter element.

In FIG. 13C, hybrid three-dimensional imaging pixel groups 100-1, 100-2, 100-3, and 100-4 may all have white ("W") or clear color filter elements. In this embodiment, no color filter elements may be included (such that the pixel groups are exposed to unfiltered light). Alternatively, a color filter element may be included that allows all visible light or all visible and infrared light to pass through the filter. In general, any desired color filter pattern may be used to cover the hybrid three-dimensional imaging pixel groups.

In some of the aforementioned embodiments, photodiodes are used to obtain time-of-flight information. As discussed, time-of-flight imaging systems may use a light source that emits light at predetermined times. It should be noted that the light source may have other functionality within the electronic device or imaging system. For example, in some cases a hybrid three-dimensional imaging pixel group (as shown in FIG. 10, for example) may be included in an image sensor that is included in a vehicle. Vehicles may include light sources with existing functionality (i.e., a headlight or tail light). These types of light sources may also be used as the light sources for obtaining the time-of-flight information in the image sensor. In general, the light source for obtaining the time-of-flight information may have any other desired functionality.

In various embodiments, an imaging system may include an image sensor that includes a first substrate, a second substrate, an interconnect layer that couples the first substrate to the second substrate, a first photodiode that is formed in the first substrate, a second photodiode that is formed in the first substrate, a third photodiode that is formed in the second substrate, and a microlens that covers the first, second, and third photodiodes. The first and second photodiodes may be configured to obtain phase detection information and the third photodiode may be configured to obtain time-of-flight information.

The image sensor may also include a first floating diffusion region formed in the second substrate, and a second floating diffusion region formed in the second substrate. The image sensor may also include a first transfer transistor configured to transfer charge from the first photodiode to the first floating diffusion region, a second transfer transistor configured to transfer charge from the second photodiode to the second floating diffusion region, a third transfer transistor configured to transfer charge from the third photodiode to the first floating diffusion region, and a fourth transfer transistor configured to transfer charge from the third photodiode to the second floating diffusion region. The interconnect layer may include a first interconnect formed between the first floating diffusion region and the first transfer transistor and the interconnect layer may include a second interconnect formed between the second floating diffusion region and the second transfer transistor.

The image sensor may also include a bias voltage supply terminal, a first anti-blooming transistor that is interposed between the first photodiode and the bias voltage supply terminal, and a second anti-blooming transistor that is coupled between the second photodiode and the bias voltage supply terminal. The image sensor may also include a first reset transistor coupled between the first floating diffusion region and a first bias voltage supply terminal and a second reset transistor coupled between the second floating diffusion region and a second bias voltage supply terminal. The image sensor may also include a first source follower transistor coupled to the first floating diffusion region, a first row select transistor coupled to the first source follower transistor, a second source follower transistor coupled to the second floating diffusion region, and a second row select transistor coupled to the second source follower transistor. The imaging system may also include a light source configured to emit light. The third photodiode may be configured to receive the light from the light source to obtain the time-of-flight information.

In various embodiments, an image sensor may include a first photodiode, a second photodiode, a third photodiode, a microlens that covers the first, second, and third photodiodes, a first floating diffusion region, a second floating diffusion region, a first transfer transistor configured to transfer charge from the first photodiode to the first floating diffusion region, a second transfer transistor configured to transfer charge from the second photodiode to the second floating diffusion region, a third transfer transistor configured to transfer charge from the third photodiode to the first floating diffusion region, and a fourth transfer transistor configured to transfer charge from the third photodiode to the second floating diffusion region.

The image sensor may also include a first reset transistor coupled between the first floating diffusion region and a first bias voltage supply terminal and a second reset transistor coupled between the second floating diffusion region and a second bias voltage supply terminal. The image sensor may also include a first source follower transistor coupled to the first floating diffusion region, a first row select transistor coupled to the first source follower transistor, a second source follower transistor coupled to the second floating diffusion region, and a second row select transistor coupled to the second source follower transistor. The first photodiode, the second photodiode, the first transfer transistor, and the second transfer transistor may be formed in a first substrate. The first floating diffusion region, the second floating diffusion region, the first source follower transistor, and the second source follower transistor may be formed in a second substrate. The first and second substrates may be connected by a metal interconnect layer.

The metal interconnect layer may include a first metal interconnect layer interposed between the first transfer transistor and the first floating diffusion region and a second metal interconnect layer interposed between the second transfer transistor and the second floating diffusion region. The third photodiode may be configured to obtain time-of-flight information. The third photodiode may be formed below the first and second photodiodes and the first and second photodiodes may be configured to obtain phase detection information.

In various embodiments, a method of operating an image sensor may be provided. The image sensor may have a first substrate that includes first and second photodiodes and a second substrate that includes a third photodiode, a first floating diffusion region, and a second floating diffusion region. The image sensor may also include a single microlens that cover the first, second, and third photodiodes. The method may include obtaining phase detection information using the first and second photodiodes and obtaining time-of-flight information using the third photodiode while obtaining the phase detection information using the first and second photodiodes.

The image sensor may also include first and second anti-blooming transistors configured to couple the first and second photodiodes to a bias voltage, a first transfer transistor configured to transfer charge from the first photodiode to the first floating diffusion region, a second transfer transistor configured to transfer charge from the second photodiode to the second floating diffusion region, a third transfer transistor configured to transfer charge from the third photodiode to the first floating diffusion region, a fourth transfer transistor configured to transfer charge from the third photodiode to the second floating diffusion region, a first reset transistor coupled to the first floating diffusion region, and a second reset transistor coupled to the second floating diffusion region. The method may also include asserting the first and second anti-blooming transistors before obtaining the phase detection information and before obtaining the time-of-flight information, asserting the first and second reset transistors to reset the first and second floating diffusion regions, and asserting the third and fourth transfer transistors to reset the third photodiode while asserting the first and second reset transistors.

The method may also include deasserting the first and second reset transistors to begin an integration time for the third photodiode after resetting the third photodiode, alternately asserting the third transfer transistor and the fourth transfer transistor during the integration time for the third photodiode, and sampling a first voltage level of the first floating diffusion region and a first voltage level of the second floating diffusion region at the end of the integration time for the third photodiode. The method may also include deasserting the first and second anti-blooming transistors to begin an integration time for the first and second photodiodes during the integration time for the third photodiode, asserting the first and second transfer transistors at the end of the integration time for the first and second photodiodes, and sampling a second voltage level of the first floating diffusion region and a second voltage level of the second floating diffusion region after asserting the first and second transfer transistors. The method may also include asserting the first and second reset transistors after sampling the first voltage level of the first floating diffusion region and the first voltage level of the second floating diffusion region and before asserting the first and second transfer transistors and sampling a reset voltage level of the first floating diffusion region and sampling a reset voltage level of the second floating diffusion region after asserting the first and second reset transistors. The reset voltage levels of the first and second floating diffusion regions may be subtracted from the first voltage levels of the first and second floating diffusion regions to obtain the time-of-flight information and the reset voltage levels of the first and second floating diffusion regions may be subtracted from the second voltage levels of the first and second floating diffusion regions to obtain the phase detection information.

The foregoing is merely illustrative of the principles of this invention and various modifications can be made by those skilled in the art. The foregoing embodiments may be implemented individually or in any combination.

What is claimed is:

1. An imaging system comprising an image sensor, the image sensor comprising:
    a first substrate;
    a second substrate;
    an interconnect layer that couples the first substrate to the second substrate;
    a first photodiode that is formed in the first substrate;
    a second photodiode that is formed in the first substrate;
    a third photodiode that is formed in the second substrate; and
    a microlens that covers the first, second, and third photodiodes, wherein the first and second photodiodes are configured to obtain phase detection information and wherein the third photodiode is configured to obtain time-of-flight information.

2. The imaging system defined in claim 1, the image sensor further comprising:
    a first floating diffusion region formed in the second substrate; and
    a second floating diffusion region formed in the second substrate.

3. The imaging system defined in claim 2, the image sensor further comprising:
    a first transfer transistor configured to transfer charge from the first photodiode to the first floating diffusion region; and
    a second transfer transistor configured to transfer charge from the second photodiode to the second floating diffusion region.

4. The imaging system defined in claim 2, the image sensor further comprising:
    a first transfer transistor configured to transfer charge from the first photodiode to the first floating diffusion region;
    a second transfer transistor configured to transfer charge from the second photodiode to the second floating diffusion region;
    a third transfer transistor configured to transfer charge from the third photodiode to the first floating diffusion region; and
    a fourth transfer transistor configured to transfer charge from the third photodiode to the second floating diffusion region.

5. The imaging system defined in claim 4, wherein the interconnect layer comprises a first interconnect formed between the first floating diffusion region and the first transfer transistor and wherein the interconnect layer comprises a second interconnect formed between the second floating diffusion region and the second transfer transistor.

6. The imaging system defined in claim 5, the image sensor further comprising:
    a bias voltage supply terminal;
    a first anti-blooming transistor that is interposed between the first photodiode and the bias voltage supply terminal; and
    a second anti-blooming transistor that is coupled between the second photodiode and the bias voltage supply terminal.

7. The imaging system defined in claim 5, the image sensor further comprising:
    a first reset transistor coupled between the first floating diffusion region and a first bias voltage supply terminal;

a second reset transistor coupled between the second floating diffusion region and a second bias voltage supply terminal;
a first source follower transistor coupled to the first floating diffusion region;
a first row select transistor coupled to the first source follower transistor;
a second source follower transistor coupled to the second floating diffusion region; and
a second row select transistor coupled to the second source follower transistor.

8. The imaging system defined in claim 1, further comprising:
a plurality of color filter elements arranged in a pattern, wherein each color filter element transmits respective wavelengths of light and wherein the plurality of color filter elements includes a single color filter element that covers the first photodiode, the second photodiode, and the third photodiode.

9. The imaging system defined in claim 1, wherein the first photodiode, the second photodiode, and the third photodiode are the only photodiodes covered by the micro lens.

10. An imaging system comprising:
an image sensor, the image sensor comprising:
a first substrate;
a second substrate;
an interconnect layer that couples the first substrate to the second substrate;
a first photodiode that is formed in the first substrate;
a second photodiode that is formed in the first substrate;
a third photodiode that is formed in the second substrate; and
a microlens that covers the first, second, and third photodiodes, wherein the first and second photodiodes are configured to obtain phase detection information and wherein the third photodiode is configured to obtain time-of-flight information; and
a light source configured to emit light, wherein the third photodiode is configured to receive the light from the light source to obtain the time-of-flight information.

11. An image sensor comprising:
a first photodiode;
a second photodiode;
a third photodiode;
a microlens that covers the first, second, and third photodiodes;
a first floating diffusion region;
a second floating diffusion region;
a first transfer transistor configured to transfer charge from the first photodiode to the first floating diffusion region;
a second transfer transistor configured to transfer charge from the second photodiode to the second floating diffusion region;
a third transfer transistor configured to transfer charge from the third photodiode to the first floating diffusion region; and
a fourth transfer transistor configured to transfer charge from the third photodiode to the second floating diffusion region.

12. The image sensor defined in claim 11, further comprising:
a first reset transistor coupled between the first floating diffusion region and a first bias voltage supply terminal; and
a second reset transistor coupled between the second floating diffusion region and a second bias voltage supply terminal.

13. The image sensor defined in claim 12, further comprising:
a first source follower transistor coupled to the first floating diffusion region;
a first row select transistor coupled to the first source follower transistor;
a second source follower transistor coupled to the second floating diffusion region; and
a second row select transistor coupled to the second source follower transistor.

14. The image sensor defined in claim 13, wherein the first photodiode, the second photodiode, the first transfer transistor, and the second transfer transistor are formed in a first substrate, wherein the first floating diffusion region, the second floating diffusion region, the first source follower transistor, and the second source follower transistor are formed in a second substrate, wherein the first and second substrates are connected by a metal interconnect layer, wherein the metal interconnect layer comprises a first metal interconnect layer interposed between the first transfer transistor and the first floating diffusion region, and wherein the metal interconnect layer comprises a second metal interconnect layer interposed between the second transfer transistor and the second floating diffusion region.

15. The image sensor defined in claim 11, wherein the third photodiode is configured to obtain time-of-flight information.

16. The image sensor defined in claim 15, wherein the third photodiode is formed below the first and second photodiodes and wherein the first and second photodiodes are configured to obtain phase detection information.

* * * * *